(12) United States Patent
Zhou et al.

(10) Patent No.: US 8,691,639 B2
(45) Date of Patent: Apr. 8, 2014

(54) MANUFACTURE METHODS OF THIN FILM TRANSISTOR AND ARRAY SUBSTRATE AND MASK

(75) Inventors: Weifeng Zhou, Beijing (CN); Jianshe Xue, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/484,835

(22) Filed: May 31, 2012

(65) Prior Publication Data

US 2012/0309136 A1  Dec. 6, 2012

(30) Foreign Application Priority Data

Jun. 1, 2011 (CN) .......................... 2011 1 0147134

(51) Int. Cl.
*H01L 21/00* (2006.01)
(52) U.S. Cl.
USPC ........... 438/151; 438/132; 438/149; 438/155; 438/158; 438/160; 257/E21.7
(58) Field of Classification Search
None
See application file for complete search history.

(56) References Cited

U.S. PATENT DOCUMENTS

| | | |
|---|---|---|
| 2001/0019129 A1 | 9/2001 | You |
| 2007/0190466 A1 | 8/2007 | Lee et al. |
| 2008/0073718 A1* | 3/2008 | Lee et al. ...................... 257/347 |
| 2010/0006839 A1 | 1/2010 | Itoh et al. |
| 2010/0155792 A1 | 6/2010 | Ryu et al. |

FOREIGN PATENT DOCUMENTS

| | | |
|---|---|---|
| EP | 0 449 404 A1 | 10/1991 |
| JP | 63-02977 A | 2/1988 |
| JP | 2009-152633 A | 7/2009 |
| JP | 2009-239033 A | 10/2009 |
| JP | 2010-021329 A | 1/2010 |
| JP | 2010-262006 A | 11/2010 |
| KR | 20010038188 A | 5/2001 |
| KR | 100801522 B1 | 2/2008 |
| WO | 97/15949 A2 | 5/1997 |

OTHER PUBLICATIONS

Extended European Search Report dated Mar. 9, 2012; Appln. No. 12170417.5-1528.
KIPO Office Action dated Jun. 26, 2013; Appln. No. 10-2012-0059137.
KIPO NOA daed Dec. 5, 2013; Appln. No. 10-2012-0059137.
First Chinese Office Action dated Jan. 23, 2014; Appln. No. 201110147134.2.

* cited by examiner

Primary Examiner — Kyoung Lee
(74) *Attorney, Agent, or Firm* — Ladas & Parry LLP

(57) ABSTRACT

Embodiments of the disclosed technology disclose manufacture methods of a thin film transistor and an array substrate and a mask therefor are provided. The manufacture method of the thin film transistor comprises: patterning a wire layer by using a exposure machine and a mask with a first exposure amount larger than a normal exposure amount during formation of source and drain electrodes; forming a semiconductor layer on the patterned wire layer; patterning the semiconductor layer by using the exposure machine and the mask with a second exposure amount smaller than the first exposure amount. The mask comprises a source region for forming the source electrode, a drain region for forming the drain electrode and a slit provided between the source region and the drain region, and the width of the slit is smaller than the resolution of the exposure machine.

8 Claims, 5 Drawing Sheets

MANUFACTURE METHODS OF THIN FILM TRANSISTOR AND ARRAY SUBSTRATE AND MASK

CROSS REFERENCE TO RELATED APPLICATIONS

This application claims the benefit to Chinese Application No. 201110147134.2, filed Jun. 1, 2011, the entire disclosure of which is incorporated herein by reference.

BACKGROUND

Embodiments of the disclosed technology relate to a manufacture method of a thin film transistor (TFT), a manufacture method of an array substrate and a mask therefor.

Thin film transistor liquid crystal displays (TFT-LCDs) have become a popular kind of flat panel displays. Reducing the manufacture costs of TFT-LCDs becomes a main concern in development in this industry.

A thin film transistor (TFT) is an important element of an array substrate of a TFT-LCD, and generally employs a configuration with bottom gate and top contact as shown in FIG. 1A. As shown in FIG. 1A, the TFT comprises a gate electrode 12, a gate insulating film 13, an active layer 15, a source electrode 14A and a drain electrode 14B from a side of a substrate 11 in this order.

However, the inventors have found that the TFT of the configuration shown in FIG. 1A has the following drawbacks. During the operation of this TFT, the conduction layer for the charge carriers generated in the active layer when an ON voltage is applied on the gate electrode is formed at the boundary between the gate insulating layer and the active layer. In this case, the carriers (electrons) have to pass through the active layer twice to communicate between the source electrode and the drain electrode, thus the electrical properties of the TFT is influenced disadvantageously.

If a TFT with bottom gate and bottom contact as shown in FIG. 1B is employed, the carriers (electrons) merely pass through a distance up to the channel length to communicate between the source electrode and the drain electrode. In this case, since the channel length is smaller than the movement distance of the electrons of the TFT of the configuration with bottom gate and top contact, the disadvantageous influence on the electrical properties of the TFT can be avoided.

During the manufacture process of the TFT with bottom gate and top contact, a four-patterning method can be employed, in which the active layer and the source and drain electrodes are formed in a same patterning process with one same mask. However, during the manufacture process of the TFT with bottom gate and bottom contact, a five-patterning method is needed in which the active layer and the source and drain electrodes are formed in different patterning processes. Since the number of the patterning processes for the TFT with bottom gate and bottom contact is increased, the manufacture cost thereof is increased as well.

SUMMARY

In one or more embodiments of the disclosed technology, a manufacture method of a thin film transistor and a manufacture method of an array substrate are provided. By using the methods, the manufacture costs of the thin film transistor and array substrate can be reduced.

According to an embodiment of the disclosed technology, the manufacture method of the thin film transistor comprises: patterning a wire layer by using a exposure machine and a mask with a first exposure amount larger than a normal exposure amount during formation of source and drain electrodes, so that the source electrode and the drain electrode spaced apart from each other are formed; forming a semiconductor layer on the patterned wire layer; and patterning the semiconductor layer by using the exposure machine and the mask with a second exposure amount smaller than the first exposure amount so that an active layer is formed; wherein the mask comprises a source region for forming the source electrode, a drain region for forming the drain electrode and a slit provided between the source region and the drain region, and the width of the slit is smaller than the resolution of the exposure machine.

According to another embodiment of the disclosed technology, a manufacture method of the array substrate comprises: forming a thin film transistor by using above-described method; forming a passivation layer on the thin film transistor; forming a via hole in the passivation layer to expose a drain electrode of the thin film transistor; and forming a pixel electrode on the passivation layer and through the via hole.

According further another embodiment of the disclosed technology, a mask for forming a thin film transistor is provided, comprising: a source region for forming a source electrode, a drain region for forming a drain electrode, and a slit provided between the source region and the drain region, wherein the width of the slit is smaller than the resolution of an exposure machine operated with the mask.

According to embodiments of the disclosed technology, during the manufacture process of the TFT with bottom gate and bottom contact, the same mask can be used for forming the source and drain electrodes and forming the active layer. Thus, the manufacture cost of the TFT can be reduced and the manufacture cost of the array substrate comprising the TFT can be reduced as well.

Further scope of applicability of the present disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE ACCOMPANYING DRAWINGS

The disclosed technology will become more fully understood from the detailed description given hereinafter and the accompanying drawings which are given by way of illustration only, and thus are not limitative of the present disclosed technology and wherein.

DETAILED DESCRIPTION

Figure 1A:
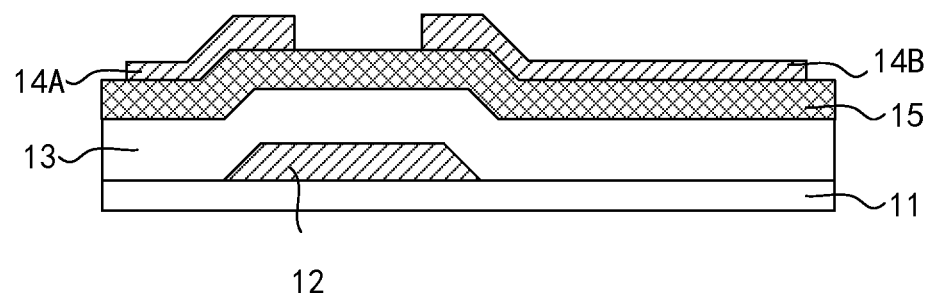
FIG. 1A is a sectional view showing a conventional TFT with bottom gate and top contact.
Figure 1B:
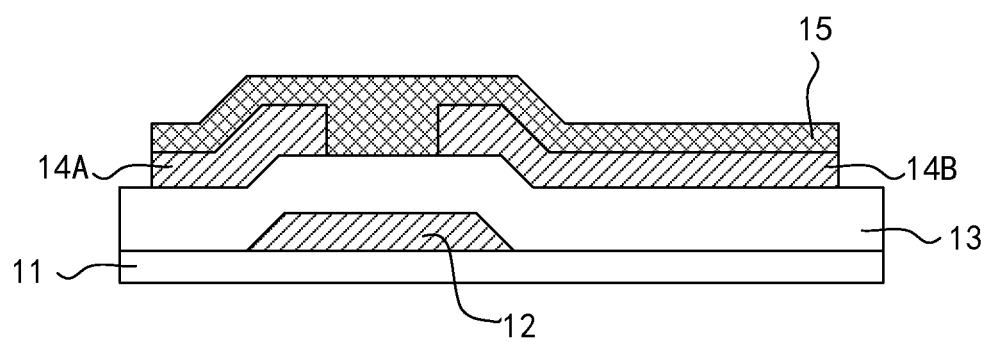
FIG. 1B is a sectional view showing a conventional TFT with bottom gate and bottom contact.

According to an embodiment of the disclosed technology, a manufacture method of a thin film transistor is provided. The method comprises the steps of: patterning a wire layer by using a exposure machine and a mask with a first exposure amount larger than the normal exposure amount during the formation of source and drain electrodes, so that a source electrode and a drain electrode spaced apart from each other are formed; forming a semiconductor layer on the patterned wire layer; patterning the semiconductor layer by using the exposure machine and the mask with a second exposure amount smaller than the first exposure amount so that an active layer is formed. The mask has a source region for forming the source electrode, a drain region for forming the drain electrode, and a slit provided between the source region and the drain region, and the width of the slit is smaller than the resolution of the exposure machine.

According to an embodiment of the disclosed technology, a manufacture method of an array substrate comprises forming a thin film transistor by using above-described method. The method may further comprise: forming a passivation layer on the thin film transistor; forming a via hole in the passivation layer to expose the drain electrode of the thin film transistor; and forming a pixel electrode on the passivation layer and through the via hole.

In the manufacture method of a TFT according to the embodiment of the disclosed technology, the source and drain electrodes can be formed by using a mask comprising the slit with a width smaller than the resolution of the exposure machine and increasing the exposure amount.

In addition, an incomplete exposure region which corresponds to the channel region of the TFT can be formed in the photoresist layer for patterning the semiconductor layer by using the same mask and decreasing the exposure amount. During the formation of the active layer, the semiconductor layer in the channel region can be prevented from being etched away with the remained photoresist in the incomplete exposure region, and accordingly the active layer with a desired pattern can be formed.

In this way, during the manufacture process of the TFT with bottom gate and bottom contact, a same mask can be used for both forming the source and drain electrodes and forming the active layer. Thus, the manufacture cost of the TFT can be reduced and the manufacture cost of the array substrate comprising the TFT can be reduced as well.

Hereinafter, the embodiments of the disclosed technology will be described in detail with reference to the accompanying drawings so that the objects, technical solutions and advantages of the embodiments of the disclosed technology will become more apparent. It should be noted that the embodiments described below are merely a portion of but not all of the embodiments of the disclosed technology, and thus various modifications, combinations and alterations may be made on basis of the described embodiments without departing from the spirit and scope of the disclosed technology.

First Embodiment

According to this embodiment, a manufacture method of a thin film transistor is provided. As shown in FIGS. 2A-2E, the method comprises the following steps.

Figure 2A:
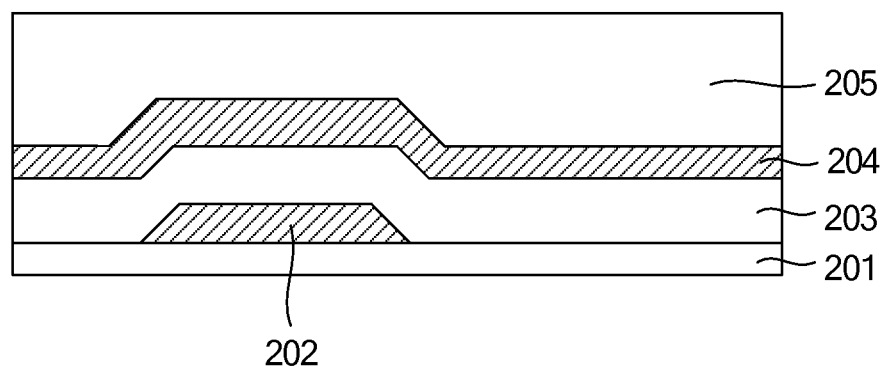
FIGS. 2A-2E are sectional views showing a manufacture process of a TFT according to a first embodiment of the disclosed technology.

In step 1, a gate electrode 202, a gate insulating layer 203, a wire layer 204 and a first photoresist layer 205 are sequentially formed on a base substrate 201 as shown in FIG. 2A.

In this step, the gate electrode 202 may be obtained by patterning a gate metal layer with a normal patterning process. In addition, the base substrate 201 may be a glass substrate, a plastic substrate, a quartz substrate and the like. The gate metal layer and the wire layer can be formed of aluminum, aluminum alloy, copper, copper alloy, or other conductive material, and the two layers may be formed of different conductive materials.

In step 2, the first photoresist layer 205 is exposed by using an exposure machine (not shown) and a mask 206 with a first exposure amount larger than the normal exposure amount. Then, the first photoresist layer is developed.

The mask 206 has a source region 207A for forming the source electrode of a thin film transistor (TFT), a drain region 207B for forming the drain electrode of the TFT, and a slit 209 provided between the source region 207A and drain region 207B and corresponding to the channel region 208 of the thin film transistor. The width L of the silt 209 is smaller than the resolution of the exposure machine.

Here, the phrase "normal exposure amount" and the phrase "normal size pattern" are defined. If the length of the shortest cross section of a pattern is not smaller than the resolution of the exposure machine or the critical dimension of the patterning process, the pattern can be referred to as a "normal size pattern". If an exposure amount exactly enables the photoresist pattern corresponding to the normal size pattern to be exposed completely, the exposure amount can be referred to as "normal exposure amount." The normal exposure amount may be different for a different photoresist material but can be determined through any one of conventional methods in tests without inventive work, and the methods are omitted here for simplicity. Photoresist may be of a positive type or a negative type as desired.

Figure 2B:
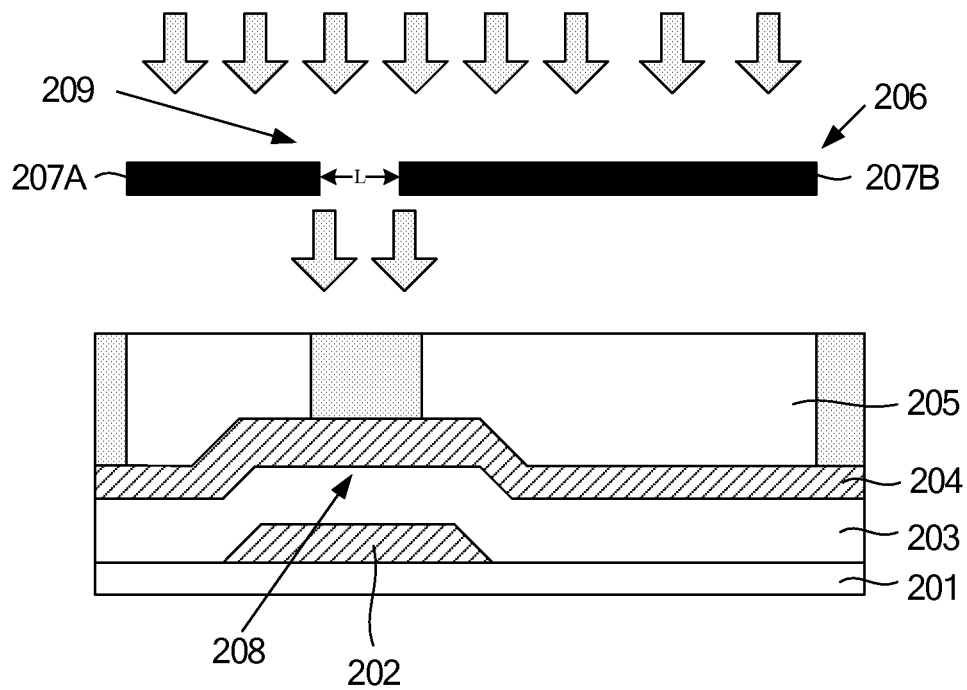

In FIG. 2B, since the width L of the slit 209 which is provided between the source region 207A and the drain region 207B and corresponds to the channel region 208 of the thin film transistor to be formed is smaller than the resolution of the exposure machine, the slit 209 is not a normal size pattern but an abnormal size pattern. When the exposure light passes through the slit 209, the light diffracts and the intensity thereof is decreased. Thus, the photoresist in the region corresponding to the slit 209 will be exposed incompletely if the normal exposure amount is employed in the exposing process, while the photoresist in the region corresponding to the slit 209 can be exposed completely if an exposure amount larger than the normal exposure amount is employed. In this step, the first exposure amount larger than the normal exposure amount is employed so that the photoresist in the region corresponding to the slit 209 is exposed completely in the exposing process and accordingly the desired photoresist pattern for forming the source and drain electrodes can be formed in the first photoresist layer 205 in the following developing process. In FIG. 2B, the shaded portions in the first photoresist layer 205 represent the portions that are exposed.

Figure 2C:
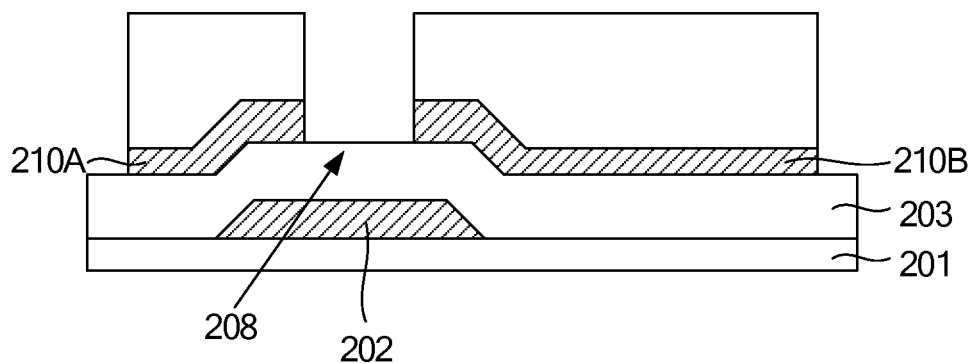

In step 3, the wire layer 204 is patterned by using the exposed and developed first photoresist layer as an etch mask to form a source electrode 210A and a drain electrode 210B as shown in FIG. 2C. Then, the first photoresist layer is removed to expose the patterned wire layer.

Figure 2D:
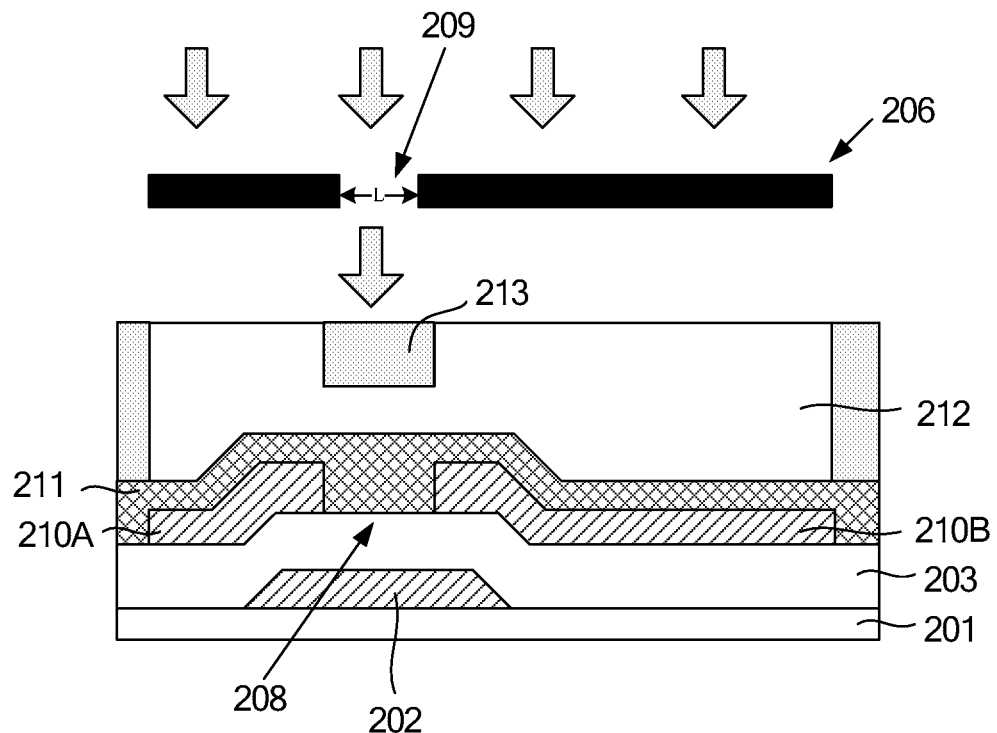

In step 4, a semiconductor layer 211 and a second photoresist layer 212 are sequentially formed on the patterned wire layer as shown in FIG. 2D. Then, the second photoresist layer 212 is exposed by using the exposure machine and the mask 206 with a second exposure amount smaller than the first exposure amount, so that an incomplete exposure region (partially exposed region) 213 is formed in the second photoresist layer 212 in the region corresponding to the slit 209 of the mask 206. In addition, regions other than the incomplete exposure region 213 in the second photoresist layer 212, which corresponds to other patterns than the slit 209 of the mask 206, are exposed completely. In FIG. 2D, the shaded portions in the second photoresist layer 212 represent the portions that are exposed.

In this step, the second exposure amount smaller than the first exposure amount is employed (for example, the normal exposure amount is employed), and the intensity of the exposure light passing through the slit 209 of the mask 206 is decreased compared with the step 2. In this case, the region in the second photoresist layer 212 corresponding to the slit 209 is exposed incompletely and the incomplete exposure region is formed, and at the same time, other regions than the incomplete exposure region 213 in the second photoresist layer 212, which corresponds to other patterns than the slit 209 of the mask 206, can be exposed completely. Then, the second photoresist layer which has been exposed is developed to obtain the desired photoresist pattern for forming the semiconductor layer pattern.

Figure 2E:
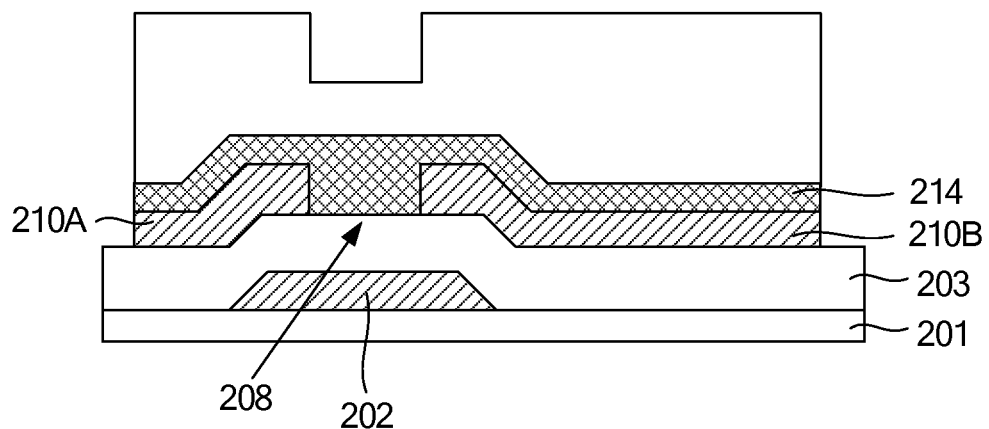

In step 5, the semiconductor layer is patterned by using the exposed and developed second photoresist layer as an etch mask to form an active layer 214 that covers the channel region 208, the source electrode 210A and the drain electrode 210B as shown in FIG. 2E.

In this step, since the incomplete exposure region of the exposed and developed second photoresist layer is retained after development, the region of the semiconductor layer 211 corresponding to the channel region 208 is prevented by the remained photoresist in the incomplete exposure region from being etched away during patterning of the semiconductor layer 211. Therefore, the region of the semiconductor layer 211 corresponding to the channel region 208 is not patterned, and the active layer 214 with the desired pattern is obtained.

According to the manufacture method of a TFT with bottom gate and bottom contact in this embodiment, the source and drain electrodes can be formed by using the mask comprising the slit with a width smaller than the resolution of the exposure machine and increasing the exposure amount.

In addition, an incomplete exposure region which corresponds to the channel region can be formed in the photoresist layer for patterning the semiconductor layer by using the same mask and decreasing the exposure amount, the semiconductor layer in the channel region can be prevented from being etched away by the remained photoresist in the incomplete exposure region during patterning of the semiconductor layer, and accordingly the active layer with a desired pattern can be formed. In this method, the same mask (that is, the mask 206) is used for forming the source and drain electrodes and forming the active layer, thus the manufacture cost can be reduced.

In one example, the width of the slit of the mask may be 1.7 μm~3.5 μm when the resolution of the exposure machine is 4 μm. However, the width of the slit of the mask is not limited to the above sizes and can be selected depending on the resolution of the exposure machine and the channel length of the TFT to be formed.

In addition, the above-described semiconductor layer 211 may be made of a semiconductor material such as amorphous silicon, organic semiconductor materials, oxide semiconductor materials, low-temperature polycrystalline silicon or the like. In this embodiment, the materials for forming the semiconductor layer 211 are not limited and can be selected depending on the properties of the TFT to be formed.

Second Embodiment

According to this embodiment, a manufacture method of an array substrate is provided. The method comprises the following steps.

Figure 3A:
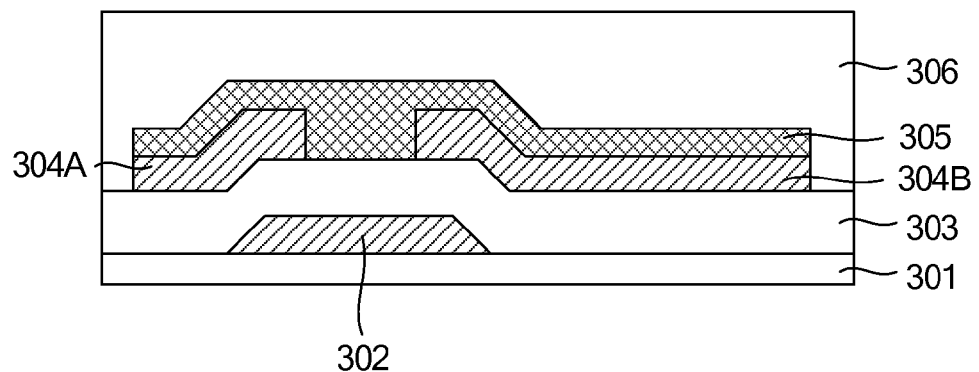
FIG. 3A-3C are sectional views showing a manufacture process of an array substrate according to a second embodiment of the disclosed technology.

In step 1, as shown in FIG. 3A, a TFT is provided on a base substrate 301 by using the method according to the first embodiment. The TFT comprises a gate electrode 302, a gate insulating layer 303, a source electrode 304A, a drain electrode 304B and an active layer 305. Then, a passivation layer 306 is formed on the active layer.

This TFT can be used for a switching element of a pixel.

Figure 3B:
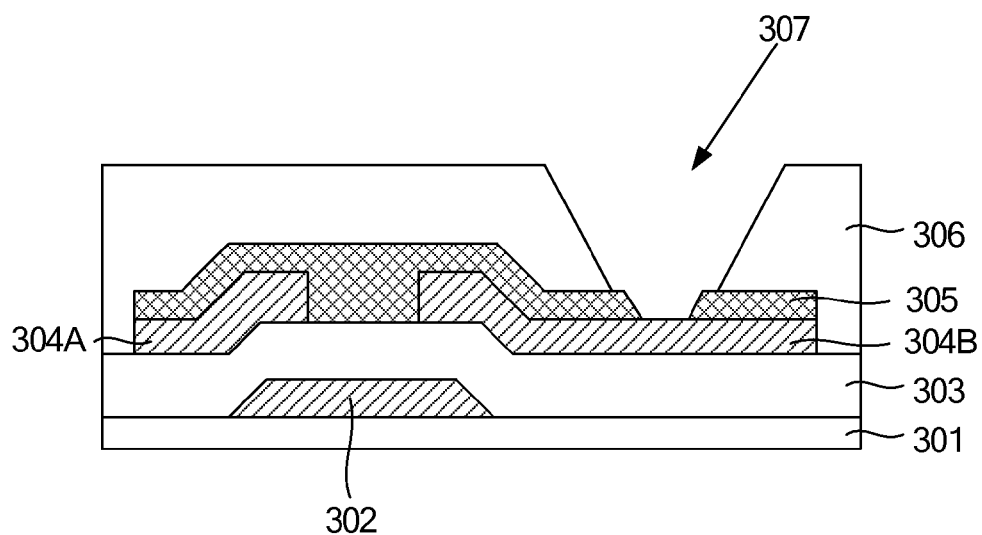

In step 2, a via hole 307 is formed in the passivation layer 306 and the active layer 305 to expose the drain electrode 304B of the TFT as shown in FIG. 3B.

Figure 3C:
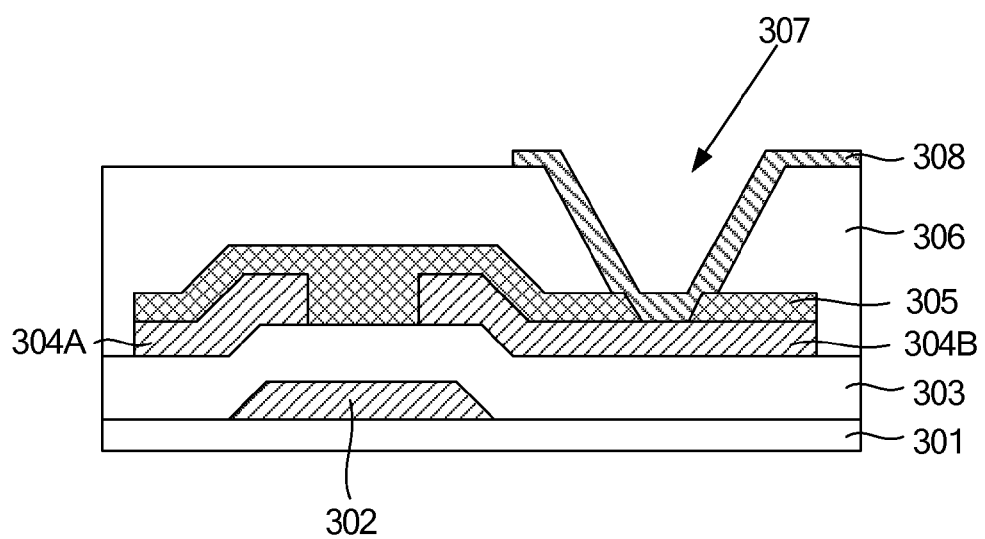

In step 3, a pixel electrode 308 is formed on the passivation layer 306 and through the via hole 307 as shown in FIG. 3C. With the via hole 307, the pixel electrode 308 is electrically connected with the drain electrode 304B.

In this embodiment, the TFT of the array substrate is manufactured by the method according to the first embodiment. During the manufacture process of the TFT, the same mask is used for forming the source and drain electrodes and forming the active layer. Thus, the manufacture costs of the TFT can be reduced and the manufacture costs of the array substrate comprising the TFT can be reduced as well.

Third Embodiment

Figure 4A:
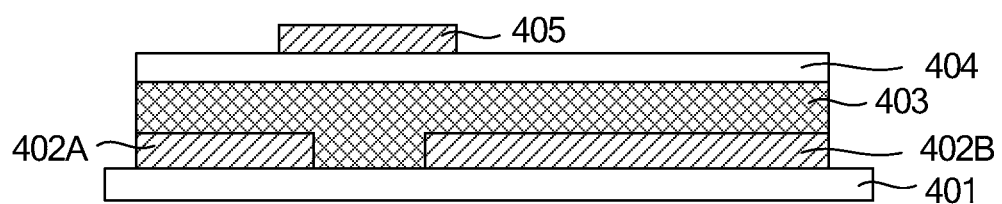
FIG. 4A is a sectional view showing a TFT with top gate and bottom contact, which is manufactured by a method according to a third embodiment of the disclosed technology.

According to this embodiment, a manufacture method of a TFT with top gate and bottom contact is provided. As shown in FIG. 4A, the method comprises the following steps.

In step 1, a source electrode 402A and a drain electrode 402B are provided on a base substrate 401.

In step 2, a patterned active layer 403 is formed on the base substrate 401 provided with the source electrode 402A and the drain electrode 402B.

The source electrode 402A, the drain electrode 402B and the patterned active layer 403 can be formed by using the method according to the first embodiment. Since the method has been described in the first embodiment, the details thereof are omitted for simplicity. Similarly, the materials for the base substrate, source and drain electrodes, the active layer can be independently elected as desired.

In step 3, a gate insulating layer 404 and a gate electrode 405 are sequentially formed on the active layer 403. In this step, the formation of the gate electrode may be accomplished by a conventional process.

Conventionally, the formation of the source and drain electrodes and the formation of the active layer can not be completed by using a same mask during manufacturing the TFT with top gate and bottom contact. However, during the manufacture process of the TFT with top gate and bottom contact according to this embodiment, the formation of the source and drain electrodes and the formation of the active layer can be completed by using the same mask because the method according to the first embodiment is employed. Therefore, according to this embodiment, the manufacture costs of the TFT with top gate and bottom contact can be reduced.

Fourth Embodiment

Figure 4B:
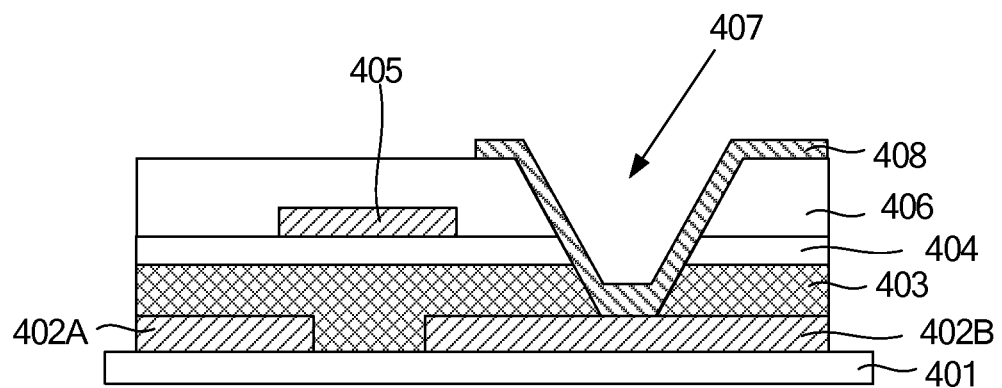
FIG. 4B is a sectional view showing an array substrate, which is manufactured by a method according to a fourth embodiment of the disclosed technology.

According to this embodiment, a manufacture method of an array substrate is provided. As shown in FIG. 4B, the method comprises the following steps.

In step 1, a TFT with top gate and bottom contact is provided on a base substrate 401 by using the method according to the third embodiment. The TFT comprises a source electrode 402A, a drain electrode 402B, an active layer 403, a gate insulating layer 404 and a gate electrode 405 from the base substrate 401 side in this order. Then, a passivation layer 406 is formed on the TFT. This TFT can be used for a switching element for a pixel.

In step 2, a via hole 407 is provided in the passivation layer 406, the gate insulating layer 404 and the active layer 403 to expose the drain electrode 402B of the TFT.

In step 3, a pixel electrode 408 is provided on the passivation layer 406 and through the via hole 407. The pixel electrode 408 is electrically connected with the drain electrode 402B with the via hole 407.

In this embodiment, since the TFT is manufactured by using the method according to the above embodiments, the manufacture costs of the TFT can be reduced and the manufacture costs of the array substrate comprising this TFT can be reduced accordingly.

The method according to this embodiment may be applied to a liquid crystal display, an organic electroluminescence display, an electronic paper display or the like.

Fifth Embodiment

According to this embodiment, a display device is provided. For example, the display device employs the thin film transistor manufactured by the method according to the first or third embodiment as a switching element for a pixel. For example, the display device may be a liquid crystal display, an organic electroluminescence display, an electronic paper display or the like.

It should be appreciated that the embodiments described above are intended to illustrate but not limit the present disclosed technology. Although the present disclosed technology has been described in detail herein with reference to the preferred embodiments, it should be understood by those skilled in the art that the present disclosed technology can be modified and some of the technical features can be equivalently substituted without departing from the spirit and scope of the present disclosed technology.

What is claimed is:

1. A manufacture method of a thin film transistor, comprising:
    patterning a wire layer by using a exposure machine and a mask with a first exposure amount larger than a normal exposure amount during formation of source and drain electrodes, so that the source electrode and the drain electrode spaced apart from each other are formed;
    forming a semiconductor layer on the patterned wire layer; and
    patterning the semiconductor layer by using the exposure machine and the mask with a second exposure amount smaller than the first exposure amount so that an active layer is formed;
    wherein the mask comprises a source region for forming the source electrode, a drain region for forming the drain electrode and a slit provided between the source region and the drain region, and the width of the slit is smaller than the resolution of the exposure machine.

2. The method according to claim 1, wherein prior to the formation of source and drain electrodes, the method further comprises:
    forming a gate electrode on a base substrate; and
    forming a gate insulating layer on the base substrate with the gate electrode,
    wherein the source electrode and the drain electrode are formed on the gate insulating layer.

3. The method according to claim 1, further comprising:
    forming a gate insulating layer on the active layer; and
    forming a gate electrode on the gate insulating layer.

4. The method according to claim 1, wherein the width of the slit of the mask is 1.7 μm~3.5 μm when the resolution of the exposure machine is 4 μm.

5. The method according to claim 2, wherein the width of the slit of the mask is 1.7 μm~3.5 μm when the resolution of the exposure machine is 4 μm.

6. The method according to claim 3, wherein the width of the slit of the mask is 1.7 μm~3.5 μm when the resolution of the exposure machine is 4 μm.

7. The method according to claim 1, wherein the semiconductor layer is made of amorphous silicon, organic semiconductor materials, oxide semiconductor materials or low-temperature polycrystalline silicon.

8. A manufacture method of an array substrate, comprising:
    forming a thin film transistor by using a method according to claim 1;
    forming a passivation layer on the thin film transistor;
    forming a via hole in the passivation layer to expose a drain electrode of the thin film transistor; and
    forming a pixel electrode on the passivation layer and through the via hole.

* * * * *